United States Patent [19]
Simons et al.

[11] Patent Number: 5,914,620
[45] Date of Patent: Jun. 22, 1999

[54] FREQUENCY DOUBLING OF A QUADRATURE-AMPLITUDE MODULATED SIGNAL USING A FREQUENCY MULTIPLIER

[75] Inventors: Brent S. Simons, Santa Clara; G. William Stockton, Los Altos, both of Calif.

[73] Assignee: Wytec, Inc., Sunnyvale, Calif.

[21] Appl. No.: 08/835,284

[22] Filed: Apr. 9, 1997

[51] Int. Cl.⁶ .................................................. H03B 19/00
[52] U.S. Cl. ......................... 327/122; 327/113; 327/116; 327/119; 327/362
[58] Field of Search .................................. 327/119, 122, 327/362, 535, 538, 113, 116

[56] References Cited

U.S. PATENT DOCUMENTS 3,796,960  3/1974  Frizzle et al. .......................... 327/122

*Primary Examiner*—Dinh Le
*Attorney, Agent, or Firm*—Burns, Doane, Swecker & Mathis LLP

[57] ABSTRACT

A method and system of frequency multiplying a signal having amplitude modulation using a frequency multiplier operated at a bias voltage that is less than its saturation mode voltage is described. Prior to amplification, the amplitude modulated signal is pre-distorted to compensate for distortion caused by the frequency multiplier. A first pre-distortion phase converts the amplitude modulated signal into a corresponding square root signal to compensate for a first distortion type. A second pre-distortion phase pre-distorts the square root signal to compensate for the distortion caused by biasing the frequency multiplier at a voltage less than the saturation voltage of the multiplier. As a result, a signal that is amplitude modulated can be multiplied by a frequency multiplier.

12 Claims, 5 Drawing Sheets

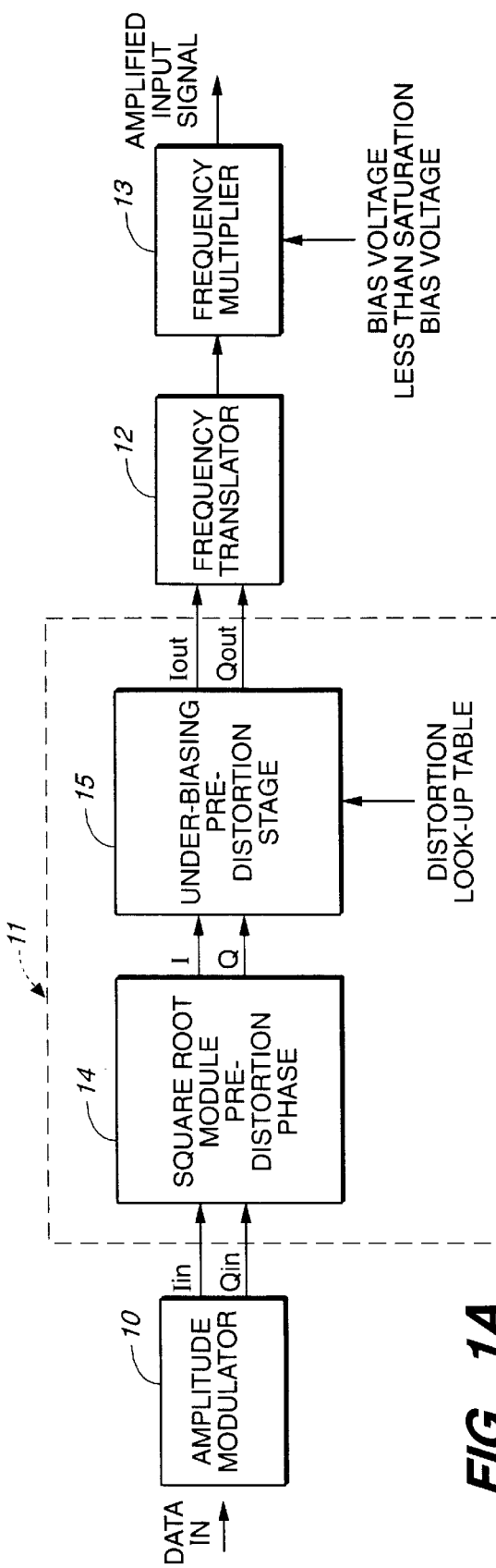
FIG._1A
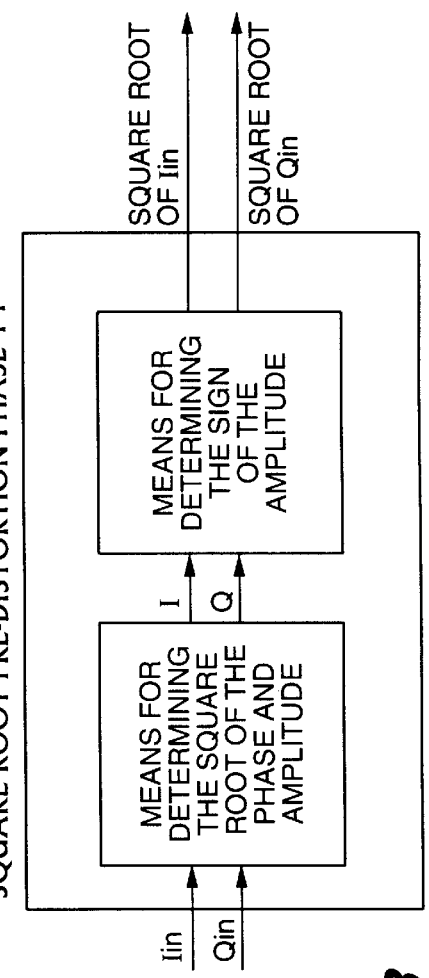
FIG._1B

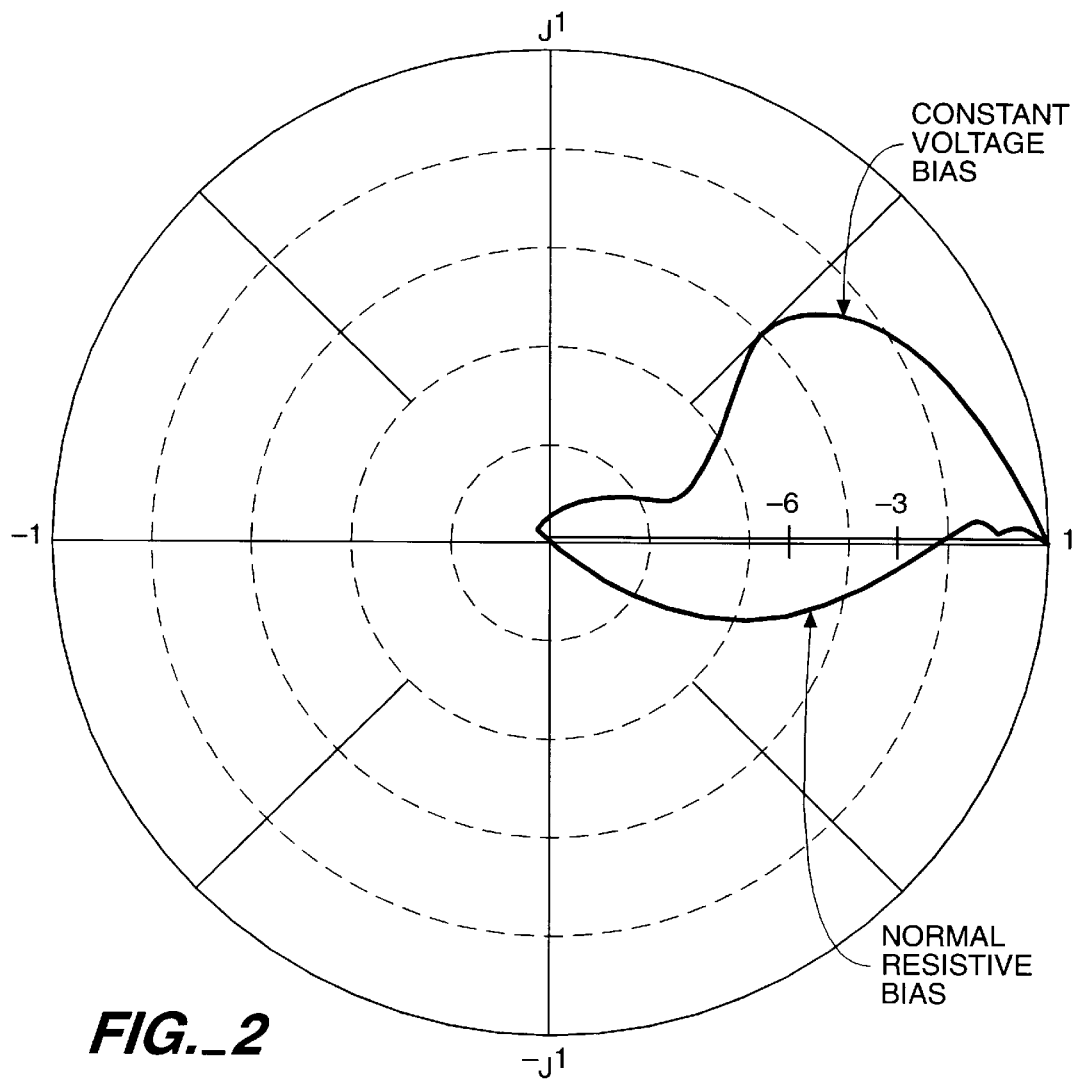
FIG._2

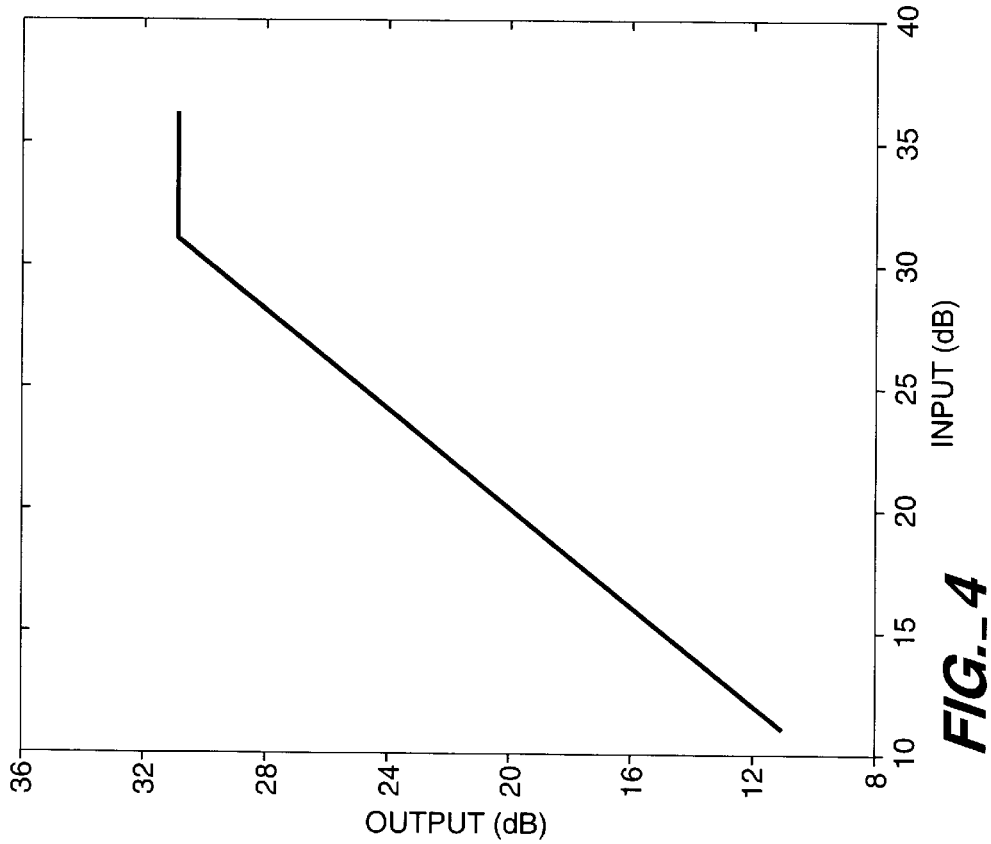
FIG._4
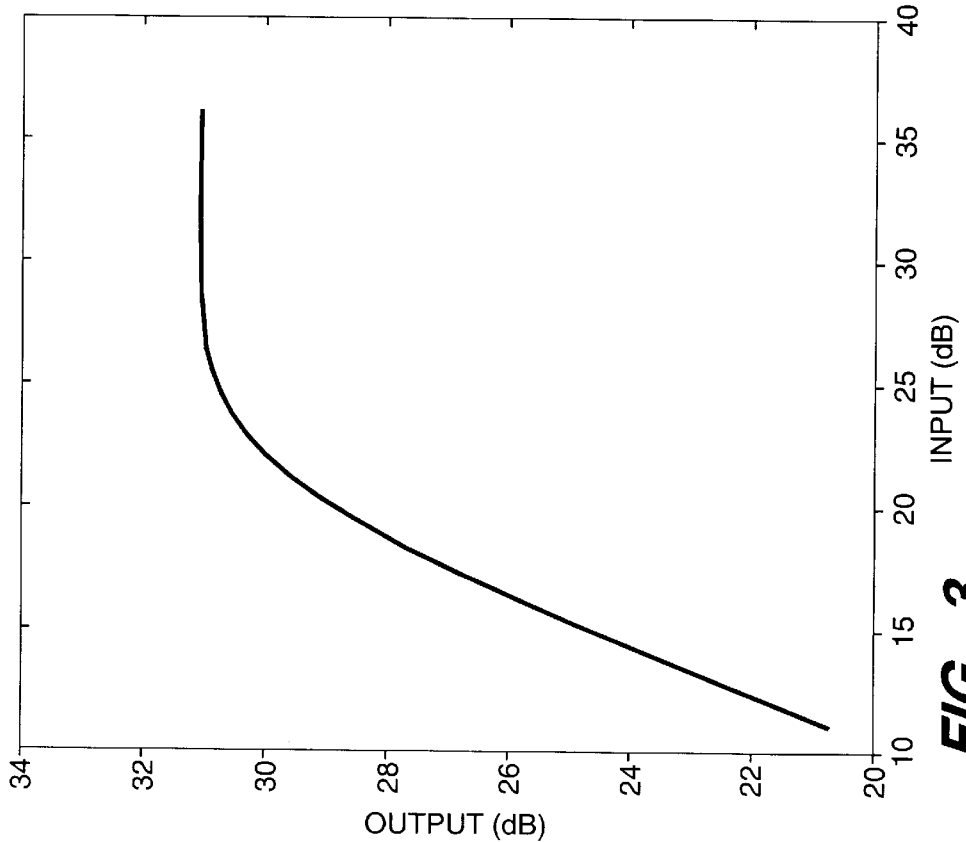
FIG._3

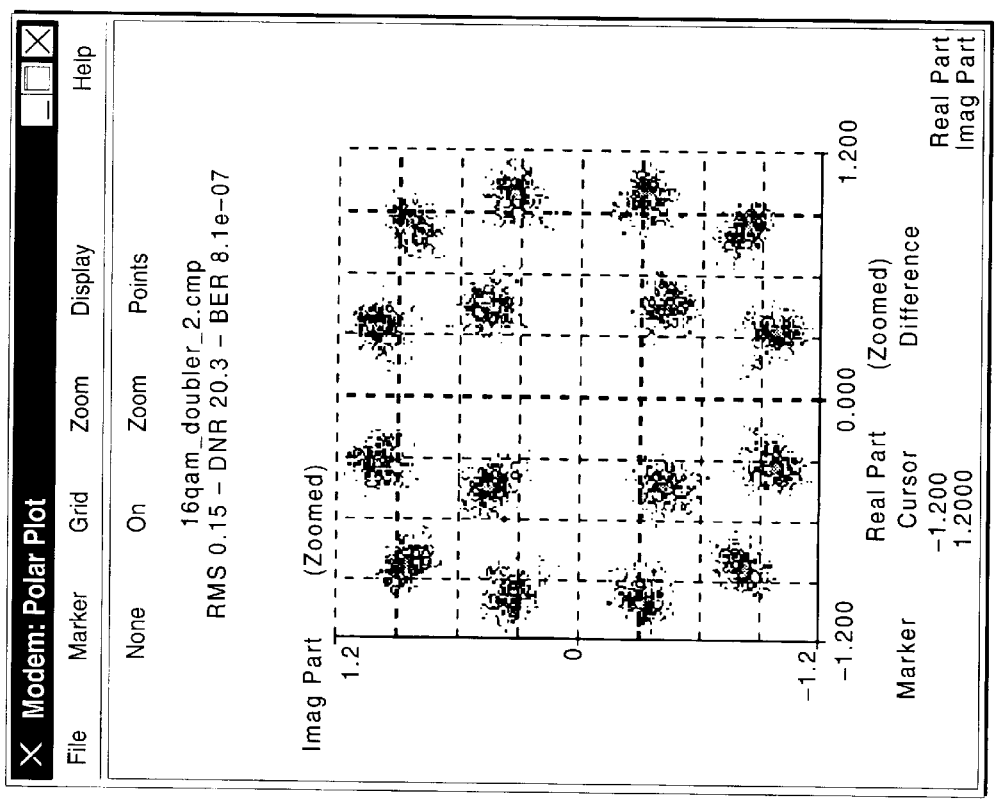
FIG._5B
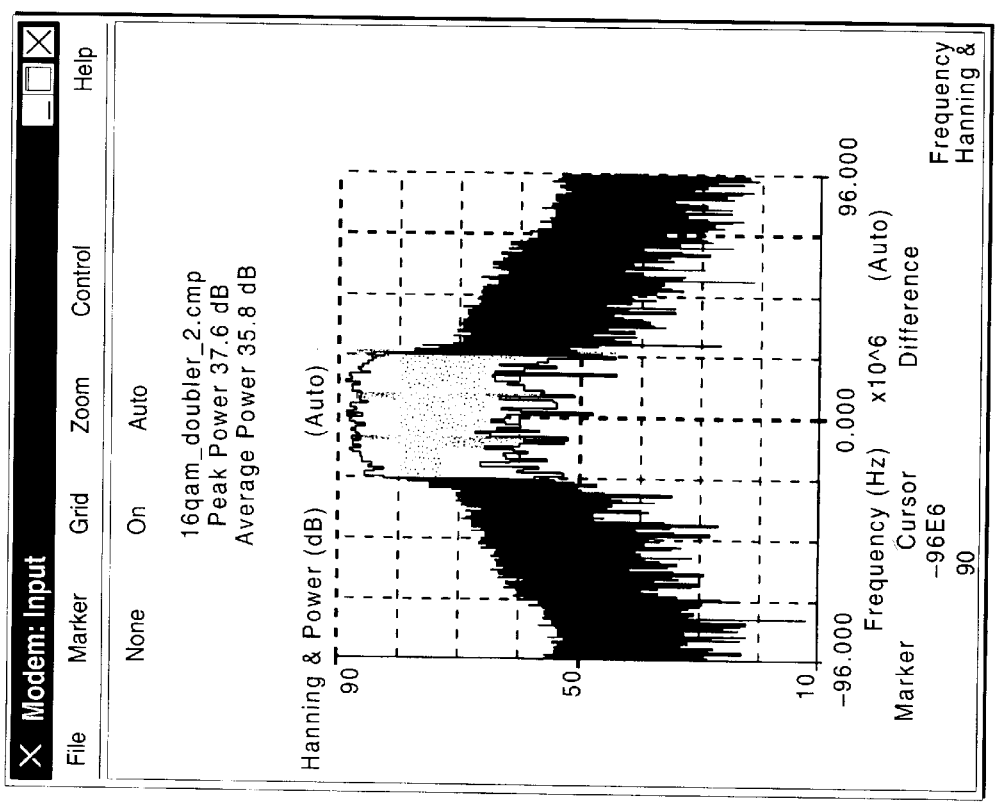
FIG._5A

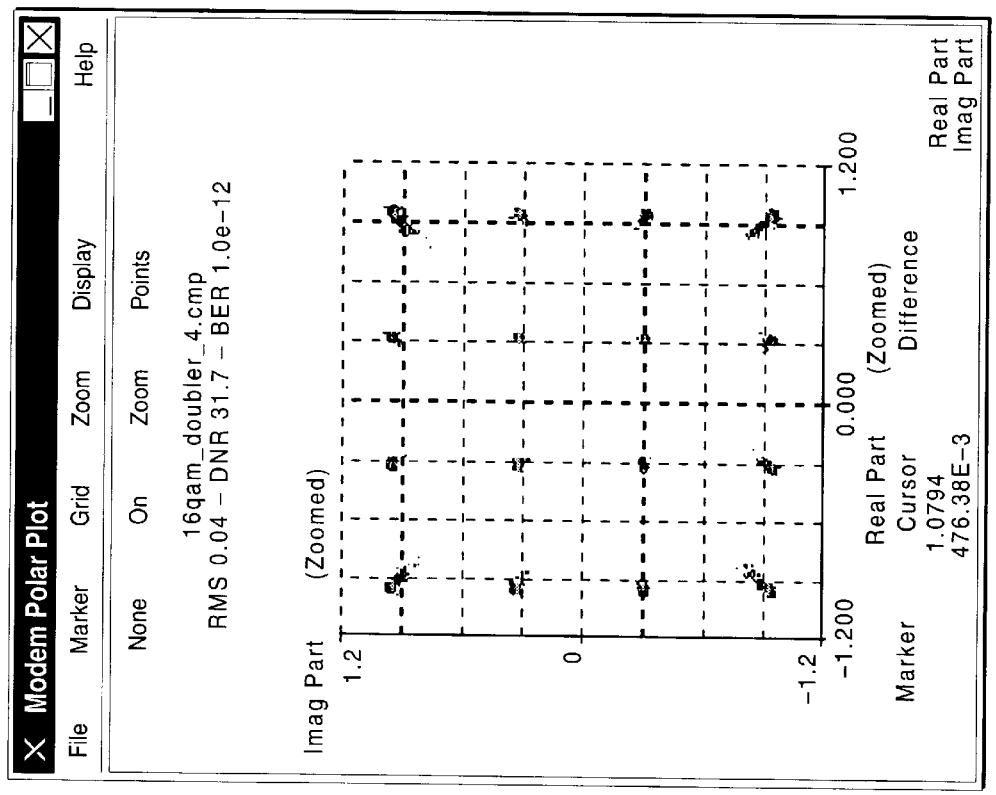
FIG._6B
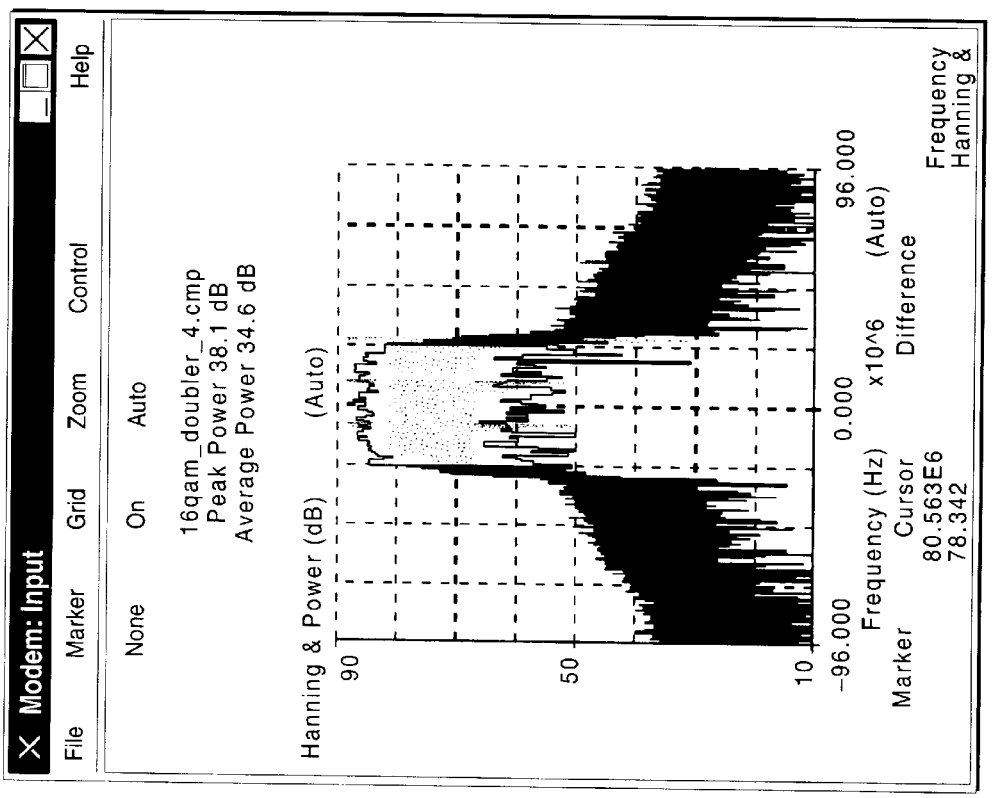
FIG._6A

FREQUENCY DOUBLING OF A QUADRATURE-AMPLITUDE MODULATED SIGNAL USING A FREQUENCY MULTIPLIER

FIELD OF THE INVENTION

The present invention relates to frequency doubling of modulated signals, and more particularly to using a frequency multiplier to frequency double high frequency quadrature amplitude modulated signals.

DESCRIPTION OF RELATED ART

In the field of digital communications, providing a clear undistorted signal is to a large part, dependent on the power of the signal being transmitted. Currently, linear amplifiers are used to amplify a modulated signal prior to signal transmission. In general, linear amplifiers are effective in obtaining 1 watt of power for a 28 GHz signal. In order to achieve higher power signals it is possible to use more than one linear amplifier. However, manufacturing problems that arise using more than one linear amplifier such as heat removal and gain and phase matching, result in higher cost.

Frequency multipliers can be used to multiply the frequency of millimeter wave communication signals and provide a greater power output than linear amplifiers. For instance, frequency multipliers can multiply a 14 GHZ signal to produce a 28 GHz signal and to provide up to 10 watts of output power. Frequency multipliers, however, are limited in that they have only been used with a modulation format that does not vary in amplitude because they are traditionally operated in a saturation state and as a result any amplitude variations are flattened on the output of the multiplier. Consequently, multipliers have been used exclusively for multiplying only frequency or phase modulated signals.

It is also well known in the communication industry that quadrature amplitude modulated (QAM) signals provide a more efficient mode of transmission when compared with an AM, FM or QPSK phase modulated signals. For instance, QAM signals can encode more data with less bandwidth than other modulated signals. Furthermore, QAM signals have a high spectral efficiency. However, as described above, frequency multipliers have not been considered as a viable means for amplifying QAM signals since QAM signals have amplitude variations that would not be passed by the saturated multiplier. In addition to being unable to amplify QAM signals due to their inherent phase variations, frequency multipliers also have the affect of nonlinearly distorting the amplitude of any amplitude modulated signal including a QAM signal. Specifically, the output amplitude of a signal being amplified by a frequency multiplier is the square of its input amplitude.

SUMMARY OF THE INVENTION

The present invention is a system and method of frequency multiplying an amplitude modulated signal using a frequency multiplier. In one embodiment, the modulated signal is a quadrature amplitude modulated (QAM) signal.

In accordance with the method of the present invention, the operating point of the frequency multiplier is selected to be less than the saturation operating point. In this mode of operation, both amplitude and phase modulations are passed by the frequency multiplier. However, the amplitude and phase modulations are distorted when the frequency multiplier is biased at the less than saturation operating point. In order to compensate for the distortion caused by under-biasing the frequency multiplier, (i.e., biasing with a voltage less than the frequency multiplier saturation voltage), the performance of the frequency multiplier is initially characterized to determine output distortion vs. bias voltage. It has been determined that this characterization is consistent for frequency multipliers from the same manufacturing lot. In the embodiment in which the input signal is a QAM signal the frequency multiplier is characterized for both output signal amplitude distortion vs. bias voltage and phase (or frequency) output distortion vs. bias voltage.

The system of the present invention includes a pre-distortion stage and an under-biased frequency multiplier. The pre-distortion stage includes two phases. A first phase for compensating for the squaring amplitude distortion caused by the frequency multiplier and a second phase for compensating for the distortion caused by under-biasing the frequency multiplier. In one embodiment, the initial characterization information can be stored in a look-up table and is used to determine the amount of pre-distortion that needs to be applied to the input signal by the second phase to compensate for under biasing the frequency multiplier. In the case of a QAM signal, the input signal is both amplitude and phase (or frequency) distorted.

BRIEF DESCRIPTION OF THE DRAWINGS

FIG. 1A shows one embodiment of a system of the present invention for amplification of a amplitude modulated signal by a frequency multiplier.

FIG. 1B shows the functional elements of the square root pre-distortion phase shown in FIG. 1A.

FIG. 2 shows a characterization of bias voltage vs. amplitude distortion of the output signal for a typical frequency multiplier.

FIG. 3 shows the transfer function curve of a uncompensated frequency multiplier.

FIG. 4 shows the transfer function curve of a compensated frequency multiplier.

FIG. 5A shows the power spectrum of a signal amplified with an uncompensated frequency multiplier.

FIG. 5B shows the demodulated polar plot of a signal amplified with an uncompensated frequency multiplier.

FIGS. 6A shows the power spectrum of a signal amplified with an compensated frequency multiplier.

FIG. 6B shows the demodulated polar plot of a signal amplified with a compensated frequency multiplier.

DESCRIPTION OF PREFERRED EMBODIMENTS

FIGS. 1A and 1B shows a system of amplification including an amplitude modulator 10, pre-distortion stage 11, frequency translator 12, and frequency doubler amplifier 13. The pre-distortion stage 11 includes two phases: the square root module pre-distortion stage 14 and the under-biasing pre-distortion phase 15. It should be noted that the modulator 10 is one in which performs modulation by at least modulating the amplitude of a carrier signal in order to encode the input data onto the carrier signal. However, it should be understood that amplitude modulator 10 may also modulate both the phase and amplitude of a carrier signal. Specifically, the modulator 10 may be a quadrature amplitude modulation (QAM) type modulator that provides a QAM signal or a quadrature phase shift keying (QPSK) modulator.

The modulator 10 outputs in-phase and quadrature phase vectors of the modulated signal and couples them to the first square root pre-distortion phase 11. The square-root pre-distortion phase essentially takes the square-root of the amplitude of the I and Q vectors of the modulated signal. Pre-distorting the modulated signal in this manner compensates for the squaring affect the frequency multiplier amplifier has thus allowing a standard amplitude modulator such as a QAM modulator to interface with a high power frequency doubling power amplifier.

The square root pre-distortion phase basically functions to convert the I and Q digital vector samples into a new I and Q digital vector samples. The digital samples are typically four to eight bits each. The square root pre-distortion phase can be implemented using digital signal processing or can be implemented with a look-up table which stores square-root phase and amplitude conversion values for incremental steps of the phase and amplitude of expected incoming digital samples. The following mathematical steps are performed to obtain the converted values:

$$Amp_{in} = \sqrt{(I_{in})^2 + (Q_{in})^2}$$

$$Phase_{in} = \tan^{-1}\left(\frac{Q_{in}}{I_{in}}\right)$$

This step determines the input amplitude and phase of the signal. The next mathematical steps are performed to determine the square-root of the input amplitude and phase.

$$Amp_{out} = \left|\sqrt{Amp_{in}}\right|$$

$$Phase_{out} = \frac{Phase_{in}}{2}$$

It should be noted that the above equations are an example of the mathematical equations that can be used to determine the square-root of the input amplitude and phase. However, it should be understood that other mathematical solutions are possible. Performing the above square root function determines the absolute value of the square root conversion for the amplitude (i.e., $Amp_{out}$) and phase (i.e., $Phase_{out}$) of the input signal. However, the sign of $Amp_{out}$ must now be determined. The reason for this is that the square root of a given number can be either positive or negative. For instance, the square root of 4 is either 2 or −2. The algorithm used to determine the sign of the square root of the amplitude determines the sign by minimizing the amplitude and phase difference between consecutive samples. In essence, the algorithm computes the $Amp_{out}$ for both the positive and negative sign signal and then determines which of these signals is closest to the last output signal. The following mathematical steps are performed in order to determine the appropriate sign:

$$I_{positive} = I_{out1} = Amp_{out} \cdot \cos(Phase_{out})$$

$$Q_{positive} = Q_{out1} = Amp_{out} \cdot \sin(Phase_{out})$$

$$I_{negative} = I_{out2} = Amp_{out} \cdot \cos(Phase_{out})$$

$$Q_{negative} = Q_{out2} = Amp_{out} \cdot \sin(Phase_{out})$$

As indicated, $I_{out1}$ and $Q_{out1}$ represent the I and Q vectors of the converted square root signal having a positive sign and $I_{out2}$ and $Q_{out2}$ represent the I and Q vectors of the converted square root signal having a negative sign. To select the closest between the positive and negative signed square root signals to the last output signal the following algorithm steps are performed:

$$Diff_1 = (I_{out1} - I_{outlast})^2 + (Q_{out1} - Q_{outlast})^2$$

$$Diff_2 = (I_{out2} - I_{outlast})^2 + (Q_{out2} - Q_{outlast})^2$$

If $Diff_1 < Diff_2$ then
 $I_{out} = I_{out1}$
 $Q_{out} = Q_{out1}$
Else
 $I_{out} = I_{out2}$
 $Q_{out} = Q_{out2}$
Endif
 $I_{outlast} = I_{out}$
 $Q_{outlast} = Q_{out}$ Hence in the above sequence of steps the closest I and Q vectors (i.e., $I_{out}$ and $Q_{out}$) to the last I and Q vectors are determined. In the last step of the sequence, $I_{outlast}$ and $Q_{outlast}$ are assigned the new I and Q vectors so as to determine the sign of the next digital sample.

The output of the square root pre-distortion phase is coupled to the input of the under biasing pre-distortion phase 15. This pre-distortion phase converts the I and Q vector samples to compensate for the distortion that is caused by under-biasing the frequency multiplier.

Typically a frequency multiplier amplifier is biased to operate in a saturation mode. However, in this mode of operation, the frequency multiplier cuts-off a portion of an amplitude modulated signal. Hence, in accordance with one embodiment of a method for operating a frequency multiplier, the operating point of frequency multiplier 13 is selected to be less than the saturation operating point such that the amplitude of the modulated signal being amplified is not cut-off. In this mode of operation, both amplitude and phase modulations are passed by the frequency multiplier. However, the amplitude and phase modulations are distorted when the frequency multiplier is biased at the less than saturation operating point. Under biasing pre-distortion phase 15 functions to compensate for the distortion caused by under-biasing the frequency multiplier, (i.e., biasing with a voltage less than the frequency multiplier saturation voltage).

Initially, the performance of the frequency multiplier needs to be characterized to determine output distortion vs. bias voltage. It has been determined that this characterization is consistent for frequency multipliers from the same manufacturing lot. FIG. 2 shows a characterization of the output signal amplitude distortion vs. bias voltage for one embodiment of the present invention in which the input signal is a QAM signal. The information obtained from the characterization is stored in a distortion look-up table which can be accessed by the I and Q values provided from the previous pre-distortion phase 14.

The I and Q vector pre-distortion values obtained by accessing the pre-distortion look-up table are then provided to frequency translator 12 which functions to translate the I and Q digital samples to an intermediate frequency (IF) signal. This translation is typically performed by a conventional amplitude and phase modulator.

The IF frequency signal generated by frequency translator 12 is then coupled to the frequency multiplier and amplified. Frequency multiplier 13 functions to multiply the frequency of the IF signal.

FIGS. 3–6 show characterization curves for uncompensated (FIGS. 3, 5A, and 5B) and compensated (FIGS. 4, 6A, and 6B) frequency multipliers. FIG. 3 shows the transfer function (output power vs. input power) for a frequency multiplier amplifier without amplitude and phase correction (i.e., uncompensated). As shown, the transfer function becomes non-linear as it approaches saturation. The affect of this non-linear transfer function is that signals amplified with this frequency multiplier will not be amplified linearly. In contrast, FIG. 4 illustrates the transfer function for a compensated frequency multiplier amplifier. As can be seen, the transfer function for this amplifier is linear all the way to saturation resulting in an extremely linear amplification.

FIG. 5A shows the power spectrum and FIG. 5B shows the demodulated polar plot for a 16 QAM signal amplified with an uncompensated frequency multiplier. FIGS. 6A and 6B show corresponding curves for a 16 QAM signal amplified with a compensated frequency multiplier. In comparing the uncompensated signal power spectrum and the compensated signal power spectrum, FIG. 5A illustrates that the bandwidth of the uncompensated signal power spectrum is wider than that of the compensated signal spectrum. Hence, it can be seen that the uncompensated frequency multiplier requires more bandwidth to pass signals that the compensated frequency multiplier. Moreover, comparing the polar plots for each of the compensated and uncompensated signals shows that the cluster of constellations are more focused in the compensated case than the uncompensated case. This indicates significant distortion in the case of the uncompensated frequency multiplier resulting in a noisier system. However, the more focused clusters shown in FIG. 6B indicate that signals amplified by the compensated frequency multiplier will result in a system with minimal noise.

It should be noted that the foregoing description of the embodiment shown in FIG. 1 is described such that the compensation circuits are implemented with digital signal processing circuitry. However, it should be understood that these compensation circuits may also be embodied with an equivalent analog implementation.

In the preceding description, numerous specific details are set forth, such as specific voltages and frequencies in order to provide a thorough understanding of the present invention. It will be apparent, however, to one skilled in the art that these specific details need not be employed to practice the present invention. In other instances, well-known signal processing structures and steps have not been described in detail in order to avoid unnecessarily obscuring the present invention.

Moreover, although the elements of the present invention have been described in conjunction with a certain embodiment, it is appreciated that the invention can be implemented in a variety of other ways. Consequently, it is to be understood that the particular embodiment shown and described by way of illustration is in no way intended to be considered limiting. Reference to the details of this embodiment is not intended to limit the scope of the claims which themselves recite only those features regarded as essential to the invention.

What is claimed is:

1. A circuit for frequency multiplication of an amplitude modulated signal comprising:
    a frequency multiplier under-biased with a voltage less than a predetermined saturation bias voltage for performing said frequency multiplication to generate an output signal;
    a pre-distortion stage receiving said amplitude modulated signal and coupled to said frequency multiplier for pre-distorting said amplitude modulated signal; said pre-distortion stage comprising:
        a first means for converting said amplitude modulated signal into a square root signal to compensate for amplitude squaring distortion caused by said frequency multiplier;
        a second means for pre-distorting said square root signal based on pre-determined characterization information stored in a first look-up table which characterizes between output signal amplitude and phase distortion and said bias voltage of said frequency multiplier to compensate for an under-biasing distortion caused by said under-biased frequency multiplier, said pre-distorting means generating a pre-distorted square root signal to said under-biased frequency multiplier.

2. The circuit in claim 1 wherein said amplitude modulated signal comprises a plurality digital samples and each sample has an amplitude and phase.

3. The circuit as described in claim 2 wherein said first means for converting said amplitude modulated signal into said square root signal includes a third means for determining the square root of said amplitude and said phase and a fourth means for determining a sign of said square root of said amplitude.

4. The circuit as described in claim 3 wherein said third means for determining the square root of said amplitude and said phase and said fourth means for determining the sign of said square root of said amplitude are implemented using digital signal processing.

5. The circuit as described in claim 3 wherein said third means for determining the square root of said amplitude and said phase and said fourth means for determining the sign of said square root of said amplitude are implemented using a second look-up table.

6. The circuit as described in claim 1 wherein said amplitude modulated signal is a quadrature amplitude modulated signal.

7. A method of frequency multiplying an amplitude modulated signal using a frequency multiplier comprising the steps of:
    under biasing said frequency multiplier with a voltage less a saturation bias voltage;
    converting said amplitude modulated signal into a square root signal to compensate for an amplitude squaring distortion caused by said frequency multiplier;
    pre-distorting said square root signal based on pre-determined characterization information characterized between output signal amplitude and phase distortion and said bias voltage of said frequency multiplier to compensate for an under-biasing distortion caused by under-biasing said frequency multiplier;
    frequency multiplying said pre-distorted square root signal to provide an output signal.

8. The method as described in claim 7 further comprising the step of generating a plurality of digital samples of said amplitude modulated signal each having an amplitude and phase.

9. The method as described in claim 8 wherein said step of converting said amplitude modulated signal into a square root signal includes the steps of determining the square root of said amplitude said phase and determining a sign of said square root of said amplitude.

10. The method as described in claim 9 wherein said step of converting said amplitude modulated signal into said square root signal is performed using digital signal processing.

11. The method as described in claim 9 wherein said step of converting said amplitude modulated signal into said square root signal is performed using a look-up table.

12. The method as described in claim 7 wherein said amplitude modulated signal is a quadrature amplitude modulated signal.

* * * * *